United States Patent
Kojima et al.

(10) Patent No.: US 11,784,039 B2
(45) Date of Patent: Oct. 10, 2023

(54) METHOD FOR MANUFACTURING GALLIUM NITRIDE SEMICONDUCTOR DEVICE

(71) Applicants: DENSO CORPORATION, Kariya (JP); HAMAMATSU PHOTONICS K.K., Hamamatsu (JP); National University Corporation Tokai National Higher Education and Research System, Nagoya (JP)

(72) Inventors: Jun Kojima, Nagoya (JP); Chiaki Sasaoka, Nagoya (JP); Shoichi Onda, Nagoya (JP); Masatake Nagaya, Kariya (JP); Kazukuni Hara, Kariya (JP); Daisuke Kawaguchi, Hamamatsu (JP)

(73) Assignees: DENSO CORPORATION, Kariya (JP); HAMAMATSU PHOTONICS K.K., Hamamatsu (JP); National University Corporation Tokai National Higher Education and Research System, Nagoya (JP)

( * ) Notice: Subject to any disclaimer, the term of this patent is extended or adjusted under 35 U.S.C. 154(b) by 191 days.

(21) Appl. No.: 17/229,356

(22) Filed: Apr. 13, 2021

(65) Prior Publication Data

US 2021/0327702 A1 Oct. 21, 2021

(30) Foreign Application Priority Data

Apr. 15, 2020 (JP) .................................. 2020-073159

(51) Int. Cl.
*H01L 21/02* (2006.01)
*H01L 21/78* (2006.01)
*H01L 21/8252* (2006.01)

(52) U.S. Cl.
CPC .... *H01L 21/02008* (2013.01); *H01L 21/0254* (2013.01); *H01L 21/02293* (2013.01);
(Continued)

(58) Field of Classification Search
CPC ..................................................... H01L 21/7813
See application file for complete search history.

(56) References Cited

U.S. PATENT DOCUMENTS 5,843,590 A * 12/1998 Miura ................. H01L 21/0262
428/700
2002/0096994 A1* 7/2002 Iwafuchi ............. H01L 21/2007
257/E27.111

(Continued)

FOREIGN PATENT DOCUMENTS

JP 2016-207908 A 12/2016
JP 2018-070415 A 5/2018

OTHER PUBLICATIONS

U.S. Appl. No. 17/229,141, filed Apr. 13, 2021, Sasaoka et al.
U.S. Appl. No. 17/229,137, filed Apr. 13, 2021, Nagaya et al.

*Primary Examiner* — Yara B Green
*Assistant Examiner* — Fakeha Sehar
(74) *Attorney, Agent, or Firm* — POSZ LAW GROUP, PLC

(57) ABSTRACT

A method for manufacturing a gallium nitride semiconductor device includes: preparing a gallium nitride wafer; forming an epitaxial growth film on the gallium nitride wafer to provide a processed wafer having chip formation regions; perform a surface side process on a one surface side of the processed wafer; removing the gallium nitride wafer and dividing the processed wafer into a chip formation wafer and a recycle wafer; and forming an other surface side element component on an other surface side of the chip formation wafer.

5 Claims, 11 Drawing Sheets

(52) U.S. Cl.
CPC .. *H01L 21/02354* (2013.01); *H01L 21/02389* (2013.01); *H01L 21/7813* (2013.01); *H01L 21/8252* (2013.01)

(56) References Cited

U.S. PATENT DOCUMENTS

| | | | |
|---|---|---|---|
| 2004/0245543 A1* | 12/2004 | Yoo | H01L 33/0093 438/22 |
| 2020/0365462 A1* | 11/2020 | Iwasawa | B23K 26/0624 |
| 2021/0053148 A1* | 2/2021 | Rieske | H01L 21/02378 |
| 2021/0066547 A1* | 3/2021 | Doan | H01L 33/0093 |
| 2022/0093579 A1* | 3/2022 | Kishimoto | H01L 25/167 |

* cited by examiner

METHOD FOR MANUFACTURING GALLIUM NITRIDE SEMICONDUCTOR DEVICE

CROSS REFERENCE TO RELATED APPLICATION

The present application claims the benefit of priority from Japanese Patent Application No. 2020-073159 filed on Apr. 15, 2020. The entire disclosure of the above application is incorporated herein by reference.

TECHNICAL FIELD

The present disclosure relates to a gallium nitride semiconductor device made of gallium nitride (hereinafter, also simply referred to as GaN) and a method for manufacturing the same.

BACKGROUND

Conventionally, a manufacturing method for manufacturing the semiconductor chip has been proposed in which an epitaxial film is formed on a semiconductor wafer to form a processed wafer, a semiconductor element is formed on the processed wafer, and then the processed wafer is divided into semiconductor chips. Specifically, in this manufacturing method, assuming that the surface of the processed wafer on the epitaxial film side is one surface and the surface of the processed wafer on the semiconductor wafer side is the other surface, first, a one surface side element component for providing a part of the semiconductor element such as a diffusion layer and a surface electrode is formed on one surface side of the processed wafer. Next, the other surface side of the processed wafer is ground to a predetermined thickness, and the other surface side element component for providing the other surface side part of the semiconductor element such as the back surface electrode is formed on the other surface side of the processed wafer. After that, the processed wafer is divided into chips as a unit.

SUMMARY

According to an example, a method for manufacturing a gallium nitride semiconductor device includes: preparing a gallium nitride wafer; forming an epitaxial growth film on the gallium nitride wafer to provide a processed wafer having chip formation regions; perform a surface side process on a one surface side of the processed wafer; removing the gallium nitride wafer and dividing the processed wafer into a chip formation wafer and a recycle wafer; and forming an other surface side element component on an other surface side of the chip formation wafer.

BRIEF DESCRIPTION OF THE DRAWINGS

The above and other objects, features and advantages of the present disclosure will become more apparent from the following detailed description made with reference to the accompanying drawings. In the drawings:

FIG. 13 is a cross-sectional view illustrating a manufacturing process of the semiconductor chip subsequent to FIG. 1I;

DETAILED DESCRIPTION

Figure 1A:
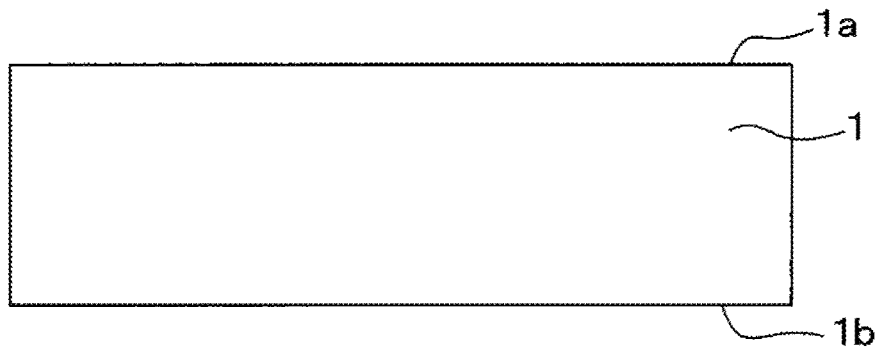
FIG. 1A is a cross-sectional view showing a manufacturing process of a semiconductor chip according to the first embodiment.

The present inventors are studying a semiconductor chip using a chip-constituting substrate including GaN, which has advantages such as a wide bandgap and a large electron saturation rate. Then, when such a semiconductor chip is manufactured by using the above manufacturing method, it becomes as follows.

That is, a GaN wafer is prepared as a semiconductor wafer, and an epitaxial film made of GaN is grown on the GaN wafer to form a processed wafer. Then, after forming the element component on one side of the processed wafer, grinding is performed from the other surface of the processed wafer. After that, the other surface side element portion is formed, and the processed wafer is divided into chips.

However, in this manufacturing method, the processed wafer is ground from the other surface. That is, the GaN wafer is ground. Therefore, it is necessary to prepare a GaN wafer every time a semiconductor chip is manufactured, which may reduce productivity.

In view of the above points, a method for manufacturing a GaN semiconductor device capable of improving productivity is provided.

An example embodiment provides a method for manufacturing a GaN semiconductor device for providing a semiconductor element made of GaN. The method includes: preparing a GaN wafer having one surface and the other surface opposite to the one surface; preparing the processed wafer having a plurality of chip formation regions (RA) and including the GaN wafer and an eptitaxial growth film by forming the epitaxial growth film on the one surface of the GaN wafer; executing a surface side process on one surface side of the epitaxial growth film of the processed wafer as a semiconductor process for one surface side of the processed wafer in the semiconductor element; after executing the surface side process, dividing the processed wafer into a chip formation wafer and a recycle wafer including the GaN wafer by removing the GaN wafer from the processed wafer; and after dividing the processed wafer, forming an other surface side element component by performing a back side process on an other surface side of the chip formation wafer opposite to the one surface on which the surface side process is performed, as the semiconductor process for the other surface side of the chip formation wafer. Then, in the dividing, the processed wafer is irradiated with laser light (L) from the GaN wafer side to form a transformation layer on at least one of the epitaxial growth film and the GaN wafer, and after forming the transformation layer, the processed wafer is divided into a chip formation wafer and a recycle wafer.

In this way, the processed wafer is irradiated with a laser to form a transformation layer, and the GaN wafer is divided from the processed wafer at the transformation layer. This makes it possible to recycle the GaN wafer as a recycle wafer. Therefore, it is not necessary to newly prepare a GaN wafer every time a semiconductor chip is manufactured, and the GaN wafer can be effectively used.

A reference numeral in parentheses attached to each configuration element or the like indicates an example of correspondence between the configuration element or the like and the specific configuration element or the like described in embodiments below.

Hereinafter, embodiments of the present disclosure will be described with reference to the drawings. In the following embodiments, the same or equivalent parts are denoted by the same reference numerals.

First Embodiment

A first embodiment will be described with reference to the drawings. Hereinafter, a method for manufacturing a GaN semiconductor device in which a semiconductor element is formed using GaN as a semiconductor material will be described.

First, as shown in FIG. 1A, a GaN wafer 1 having one surface 1a and another surface 1b and having a bulk wafer shape is prepared. For example, as the GaN wafer 1, an n type wafer having a high impurity concentration of $5 \times 10^{17}$ cm$^{-3}$ to $5 \times 10^{19}$ cm$^{-3}$, which is a dopant of silicon, oxygen, germanium, etc., is used. The thickness of the GaN wafer 1 may be arbitrary, for example, a wafer having a thickness of about 400 μm is prepared. Then, if necessary, a protection film made of an oxide film or the like may be formed on the other surface 1b or the like of the GaN wafer 1. In the GaN wafer 1 of the present embodiment, one surface 1a is a Ga surface and the other surface 1b is an N surface. Further, the GaN wafer 1 is prepared by recycling the recycle wafer 40 of FIG. 1K, which will be described later, after the manufacturing process of the semiconductor chip 100 described below is performed.

Figure 1B:
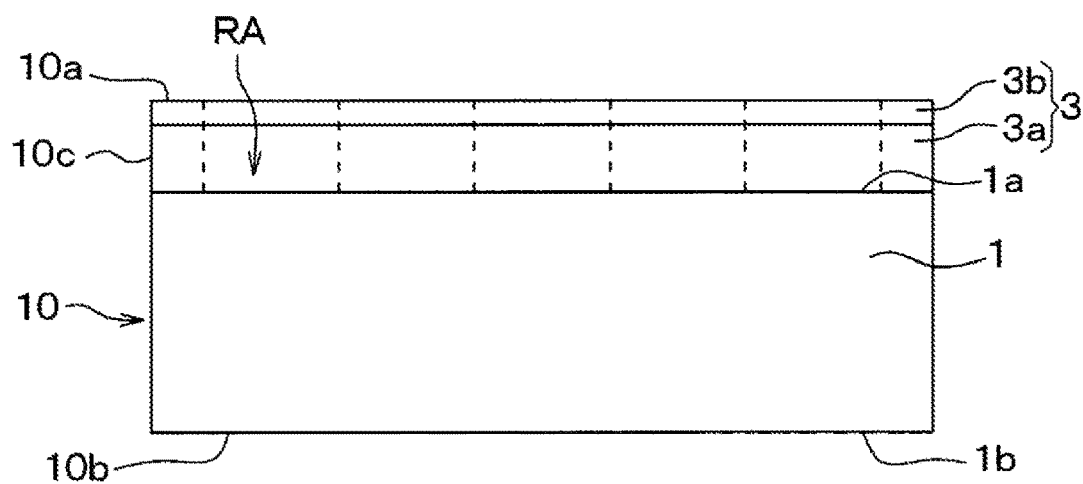
FIG. 1B is a cross-sectional view illustrating a manufacturing process of the semiconductor chip subsequent to FIG. 1A.

Next, as shown in FIG. 1B, a processed wafer 10 having a plurality of chip formation regions RA is prepared by forming an epitaxial film 3 made of GaN with a thickness of about 10 μm to 60 μm on the one surface 1a of the GaN wafer 1. In the present embodiment, the epitaxial film 3 is formed by depositing an n$^+$ type epitaxial layer 3a corresponding to the first GaN layer and an n$^-$ type epitaxial layer 3b corresponding to the second GaN layer in order from the GaN wafer 1 side. For example, the n$^+$ type epitaxial layer 3a is doped with silicon, oxygen, germanium, etc., and has an impurity concentration of about $5 \times 10^{17}$ cm$^{-3}$ to $1 \times 10^{18}$ cm$^{-3}$. Silicon or the like is doped in the n$^-$ type epitaxial layer 3b, and the impurity concentration is about $1 \times 10^{17}$ cm$^{-3}$ to $4 \times 10^{17}$ cm$^{-3}$. Here, the n$^+$ type epitaxial layer 3a has an impurity concentration that makes ohmic contact with the electrode material, and has a higher impurity concentration than the n$^-$ type epitaxial layer 3b.

The n$^-$ type epitaxial layer 3b is a portion on which the one surface side element component 11 such as the diffusion layer 12, which will be described later, is formed, and has a thickness of, for example, about 8 μm to 10 μm. The thickness of the n$^+$ type epitaxial layer 3a is, for example, about 40 μm to 50 μm. The thickness of the n$^+$ type epitaxial layer 3a and the thickness of the n$^-$ type epitaxial layer 3b may be arbitrary, for example, here, the n$^+$ type epitaxial layer 3a is thicker than the n$^-$ type epitaxial layer 3b so as to secure the thickness of the semiconductor chip 100. In the following, the surface of the processed wafer 10 on the epitaxial film 3 side is referred to as one surface 10a of the processed wafer 10, and the surface of the processed wafer 10 on the GaN wafer 1 side is referred to as the other surface 10b of the processed wafer 10. Further, the side surface 10c is defined between the one surface 10a and the other surface 10b. Each chip formation region RA is disposed on the side of the one surface 10a of the processed wafer 10.

Figure 1C:
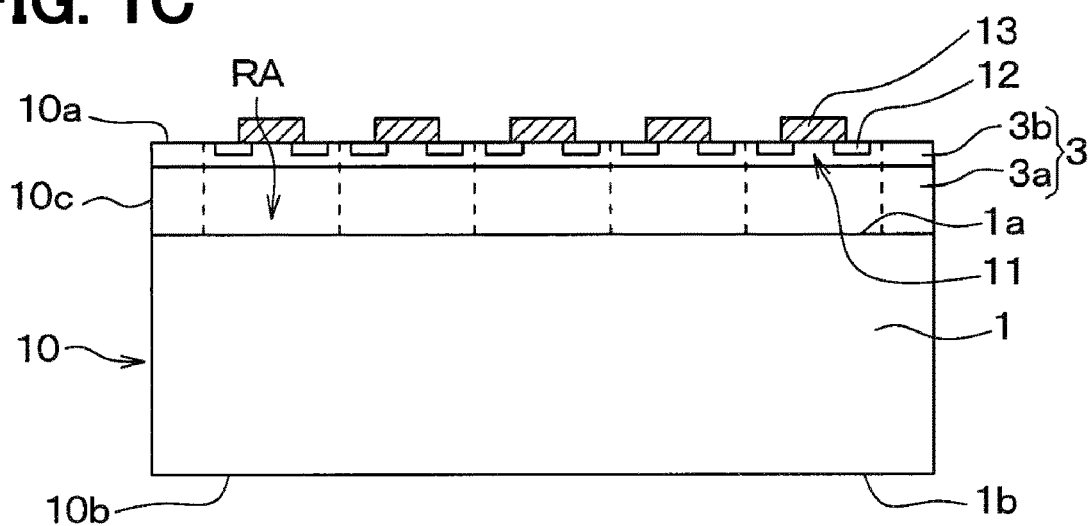
FIG. 1C is a cross-sectional view illustrating a manufacturing process of the semiconductor chip subsequent to FIG. 1B.

Next, as shown in FIG. 1C, a surface side process, which is a process for one surface 10a side of a general semiconductor manufacturing process, is performed. Specifically, as a surface-side process, a step of forming a one surface side element component 11 in a semiconductor element such as a diffusion layer 12, a gate electrode 13, a surface electrode (not shown), a wiring pattern, or a passivation film in each chip formation region RA. As the semiconductor element here, those having various configurations are adopted. For example, a power device such as a vertical MOS transistor, an optical semiconductor element such as a light emitting diode, a semiconductor laser, or the like is adopted. After that, if necessary, a surface protection film made of a resist or the like is formed on one surface 10a side of the processed wafer 10.

Figure 1D:
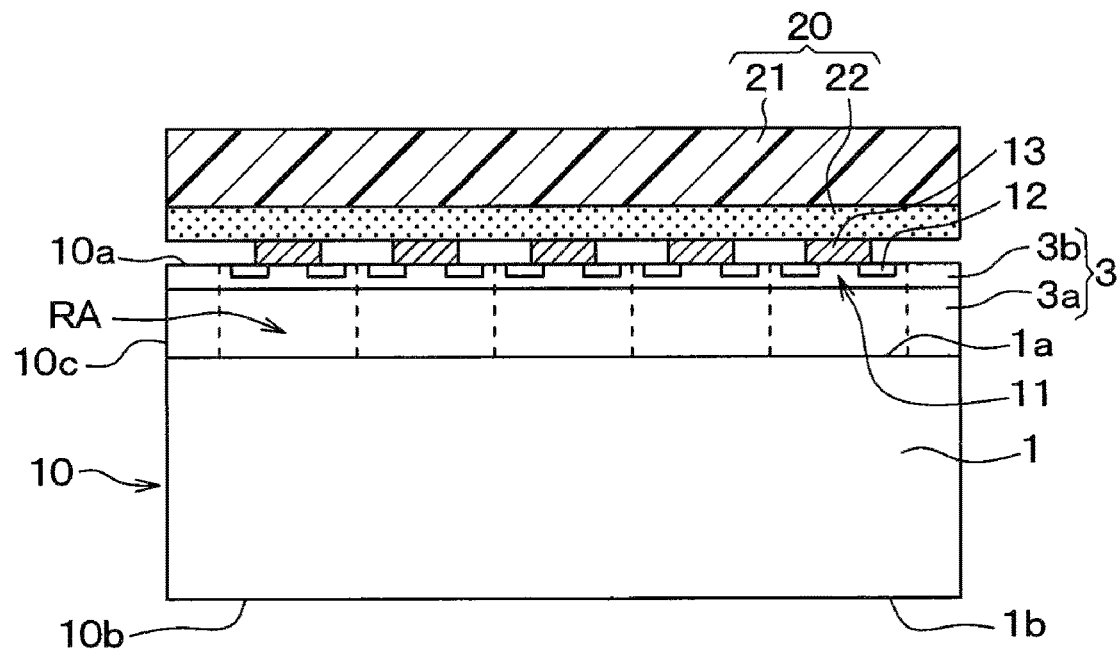
FIG. 1D is a cross-sectional view illustrating a manufacturing process of the semiconductor chip subsequent to FIG. 1C.

Subsequently, as shown in FIG. 1D, the support member 20 is arranged on the one surface 10a side of the processed wafer 10. Here, the support member 20 includes a support base 21 and an adhesive layer 22, and the support base 21 is attached to the processed wafer 10 via the adhesive layer 22. The support base 21 is for supporting the processed wafer 10 so that it can be handled even after the processed wafer 10 becomes thin, and is made of a material that does not easily warp during the manufacturing process, such as glass, a silicon substrate, and ceramics. The adhesive layer 22 may be any material as long as it can attach the support base 21 to the processed wafer 10 and peel the support base 21 from the processed wafer 10, for example, UV (Ultra Violet) cured resin, wax and double-sided tape may be used. Here, the adhesive layer 22 is a UV resin adhesive.

Figure 1E:
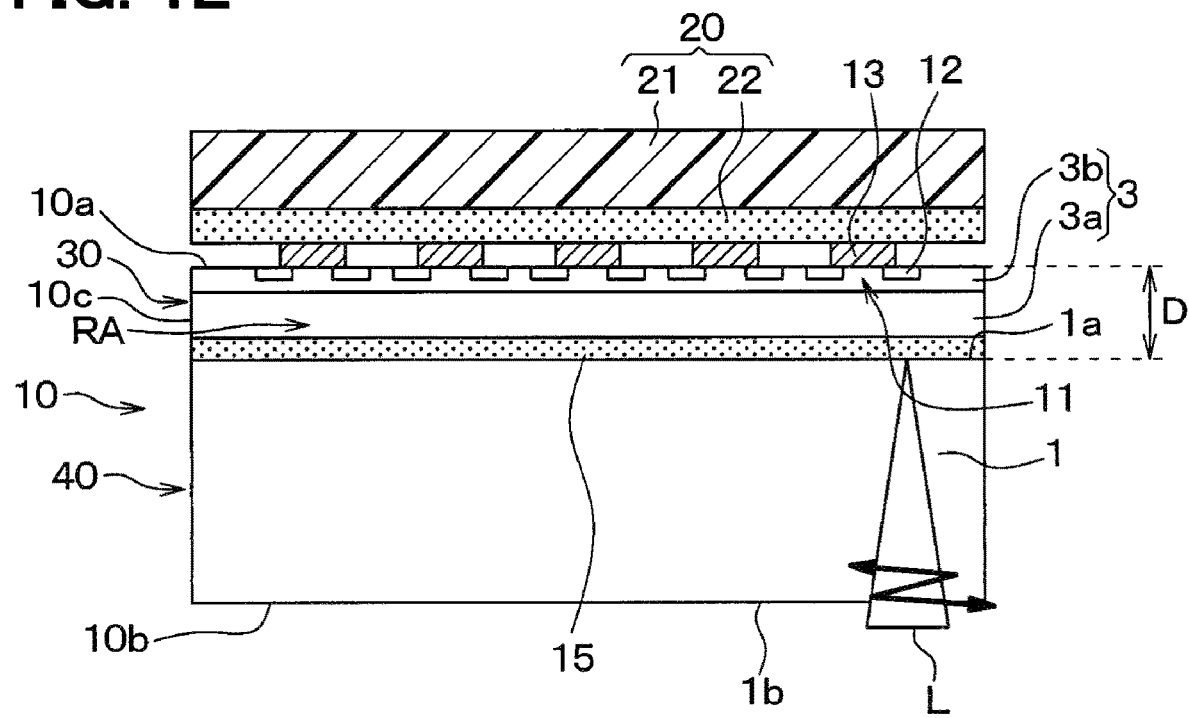
FIG. 1E is a cross-sectional view illustrating a manufacturing process of the semiconductor chip subsequent to FIG. 1D.

Subsequently, as shown in FIG. 1E, the laser beam L is irradiated from the other surface 10b of the processed wafer 10, and the wafer transformation layer 15 is formed at a position with a predetermined depth D from the one surface 10a of the processed wafer 10 along the surface direction of the processed wafer 10.

Specifically, a laser irradiation device is prepared with a laser light source that oscillates the laser beam L, a dichroic mirror arranged so as to change the direction of the optical axis (that is, the optical path) of the laser beam, a condensing lens (that is, a condensing optical system) for condensing the laser beam, a displaceable stage, and the like. Then, when the wafer transformation layer 15 is formed, the position of the stage or the like is adjusted so that the condensing point of the laser beam L is relatively scanned along the surface direction of the processed wafer 10. As a result, the wafer transformation layer 15 is formed on the processed wafer 10 along the surface direction. More specifically, by irradiating the laser beam L, the wafer transformation layer 15 is formed in which the nitrogen atom evaporates as a gas and the gallium atom is separated.

Further, although not particularly limited, in the present embodiment, when forming the wafer transformation layer 15, a solid-state laser beam having a wavelength of 532 nm of a green color laser beam is used as the laser beam L. According to the present embodiment, the laser beam L is irradiated with a processing point output of 2 µJ, a pulse width of 500 ps, and a processing speed of 500 mm/s. Here, these conditions are only one example, and the present inventors confirm that the wafer transformation layer 15 can be formed appropriately even when the processing point output of the laser beam L is further lower or the pulse width is further shorter. Further, the present inventors confirm that the wafer transformation layer 15 is appropriately formed even when the processing point output of the laser beam L is higher or the pulse width is longer.

Further, the predetermined depth D when forming the wafer transformation layer 15 is set according to the ease of handling of the semiconductor chip 100, the withstand voltage, and the like, and is about 10 µm to 200 µm. In this case, the location of the wafer transformation layer 15 is changed according to the thickness of the epitaxial film 3, and the layer 15 is formed at least in the epitaxial film 3, at the boundary between the epitaxial film 3 and the GaN wafer 1, or in the GaN wafer 1. Note that FIG. 1E shows an example in which the wafer transformation layer 15 is formed at the boundary between the epitaxial film 3 and the GaN wafer 1.

Here, as will be described later, at least a part of the GaN wafer 1 in the processed wafer 10 is recycled as the recycle wafer 40. Therefore, the wafer transformation layer 15 may be preferably formed inside the epitaxial film 3 or at the boundary between the epitaxial film 3 and the GaN wafer 1. When the wafer transformation layer 15 is formed inside the GaN wafer 1, the wafer transformation layer 15 may be preferably formed on one surface 1a side of the GaN wafer 1.

When the wafer transformation layer 15 is formed inside the epitaxial film 3, the wafer transformation layer 15 is formed inside the n$^+$ type epitaxial layer 3a instead of the n$^-$ type epitaxial layer 3b constituting the semiconductor element. In the following, the portion of the processed wafer 10 on the one surface 10a side of the wafer transformation layer 15 is referred to as the chip formation wafer 30, and the portion of the processed wafer 10 on the other surface 10b side of the wafer transformation layer 15 is referred to as the recycle wafer 40.

Figure 1F:
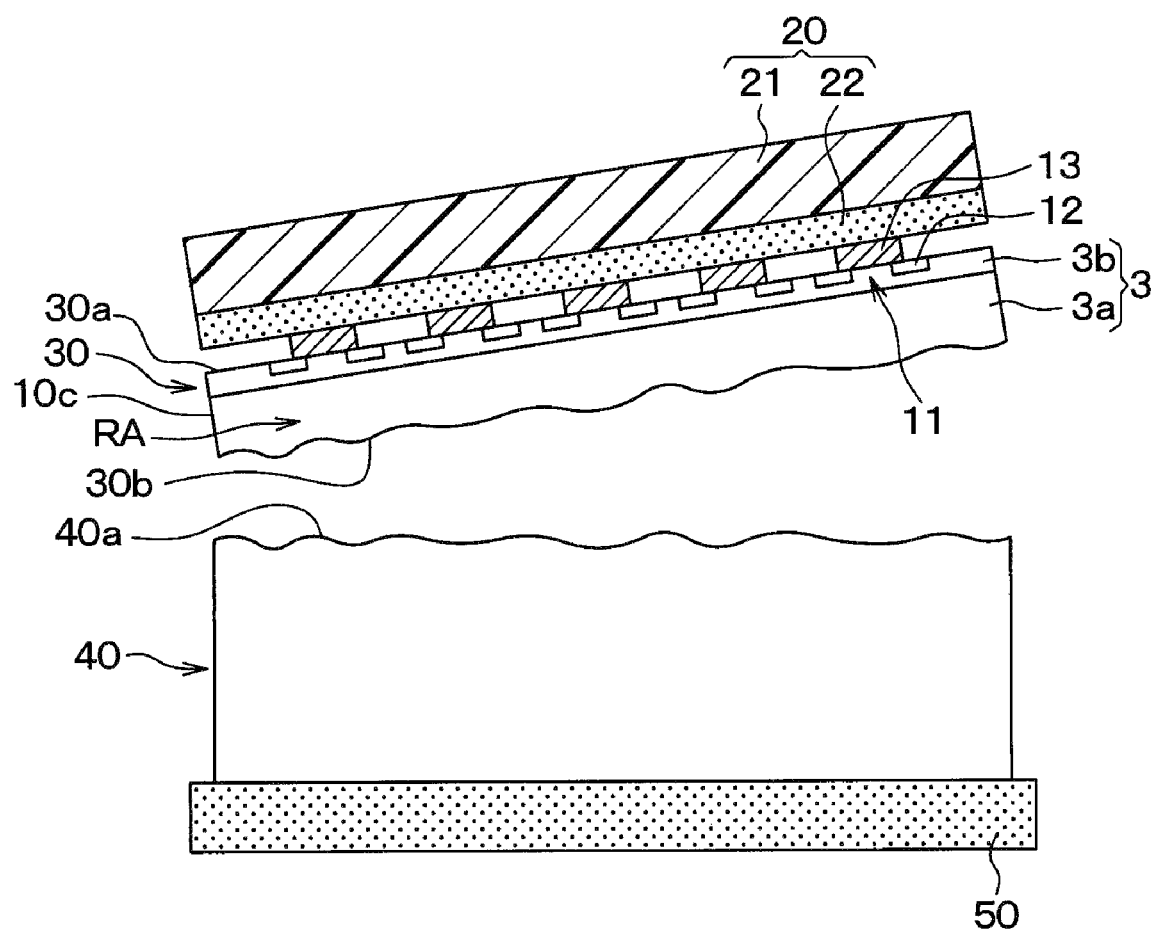
FIG. 1F is a cross-sectional view illustrating a manufacturing process of the semiconductor chip subsequent to FIG. 1E.

Next, as shown in FIG. 1F, the auxiliary member 50 is arranged on the other surface 10b side of the processed wafer 10. Although the auxiliary member 50 is shown in a simplified manner in FIG. 1F, it includes, for example, a base material and an adhesive whose adhesive strength can be changed. In this case, the base material in the auxiliary member 50 is made of, for example, glass, a silicon substrate, ceramics, etc., and the adhesive in the auxiliary member 50 is made of, for example, an ultraviolet curable resin, wax, double-sided tape, or the like. Then, the support member 21 and the auxiliary member 50 are gripped and a tensile force or the like is applied in the thickness direction of the processed wafer 10, and the wafer is divided into the chip formation wafer 30 and the recycle wafer 40 at the wafer transformation layer 15 as a boundary (that is, the starting point of branching). That is, the GaN wafer 1 is peeled from the n$^+$ type epitaxial layer 3a at the wafer transformation layer 15. At this time, as described above, the wafer transformation layer 15 is formed by irradiating GaN with a laser, a nitrogen atom evaporates as a gas, and a gallium atom is separated out. Therefore, it is divided into the chip formation wafer 30 and the recycle wafer 40 by applying a tensile force or the like.

In the following, the surface of the chip formation wafer 30 on which the one surface side element component 11 is formed is designated as the one surface 30a, and the divided surface side of the chip formation wafer 30 is referred to as the other surface 30b. The divided surface side of the recycle wafer 40 will be described as one surface 40a. Further, in each of the drawings after FIG. 1G, the wafer transformation layer 15 and the like remaining on the other surface 30b of the chip formation wafer 30 and the one surface 40a of the recycle wafer 40 are appropriately not shown.

Figure 1G:
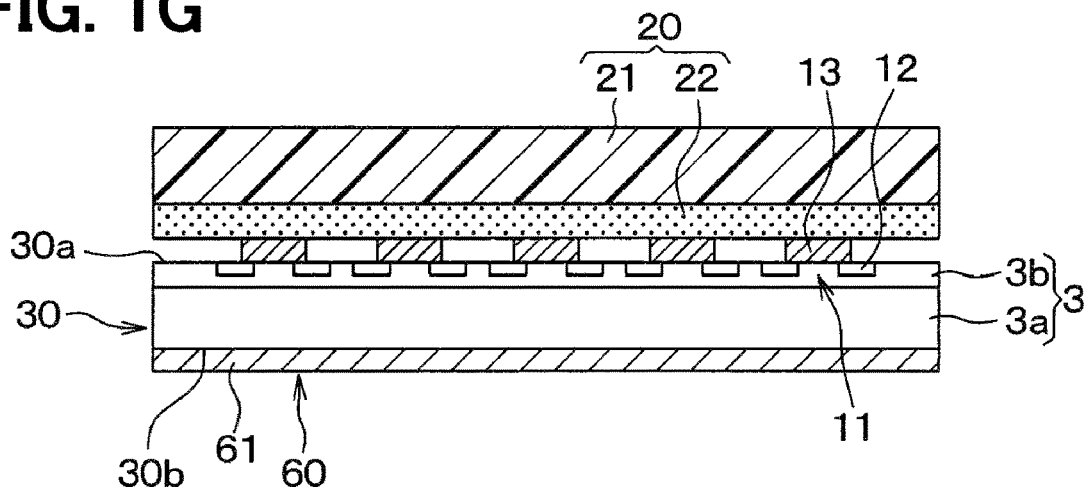
FIG. 1G is a cross-sectional view illustrating a manufacturing process of the semiconductor chip sequent to FIG. 1F.

After that, as shown in FIG. 1G, as the remaining semiconductor manufacturing process, the other surface side element component 60 of the semiconductor element such as the metal film 61 for forming the back surface electrode is formed on the other surface 30b of the chip formation wafer 30 in the back side process.

Before the step of forming the other surface side element component 60, a step of flattening the other surface 30b of the chip formation wafer 30 by a CMP (abbreviation of chemical mechanical polishing) method or the like may be performed as necessary. FIG. 1G shows a view when the other surface 30b of the chip formation wafer 30 is flattened. Further, after performing the step of forming the other surface side element component 60, heat treatment such as laser annealing or the like may be performed in order to make ohmic contact between the metal film 61 and the other surface 30b of the chip formation wafer 30 as necessary.

Figure 1H:
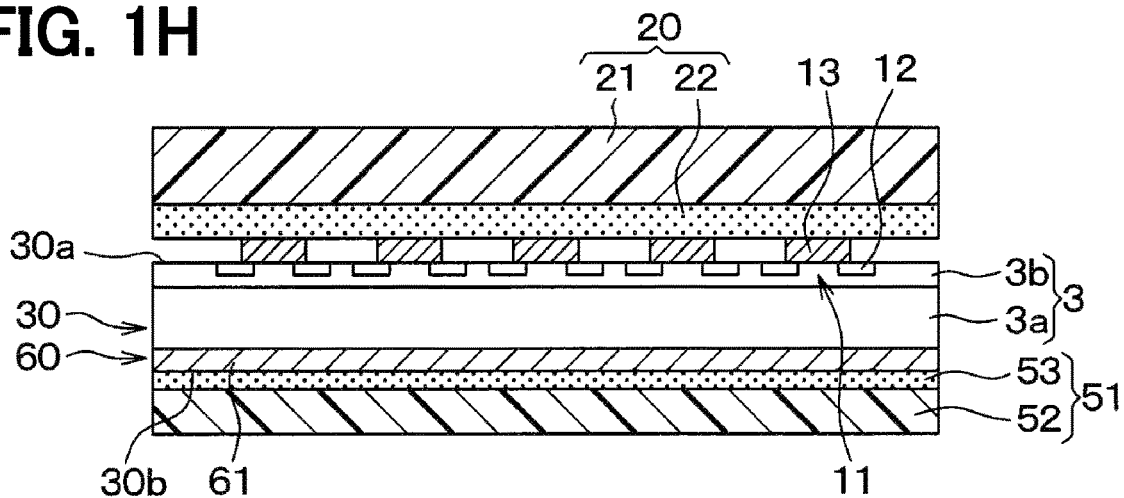
FIG. 1H is a cross-sectional view illustrating a manufacturing process of the semiconductor device subsequent to FIG. 1G.

Subsequently, as shown in FIG. 1H, the holding member 51 is arranged on the other surface 30b side of the chip formation wafer 30, that is, on the metal film 61 side. As the holding member 51, for example, a dicing tape or the like having a base material 52 and an adhesive 53 is used. The adhesive 53 is made of a material whose adhesive strength can be changed. For example, an adhesive whose adhesive strength changes depending on temperature or light is used.

Figure 1I:
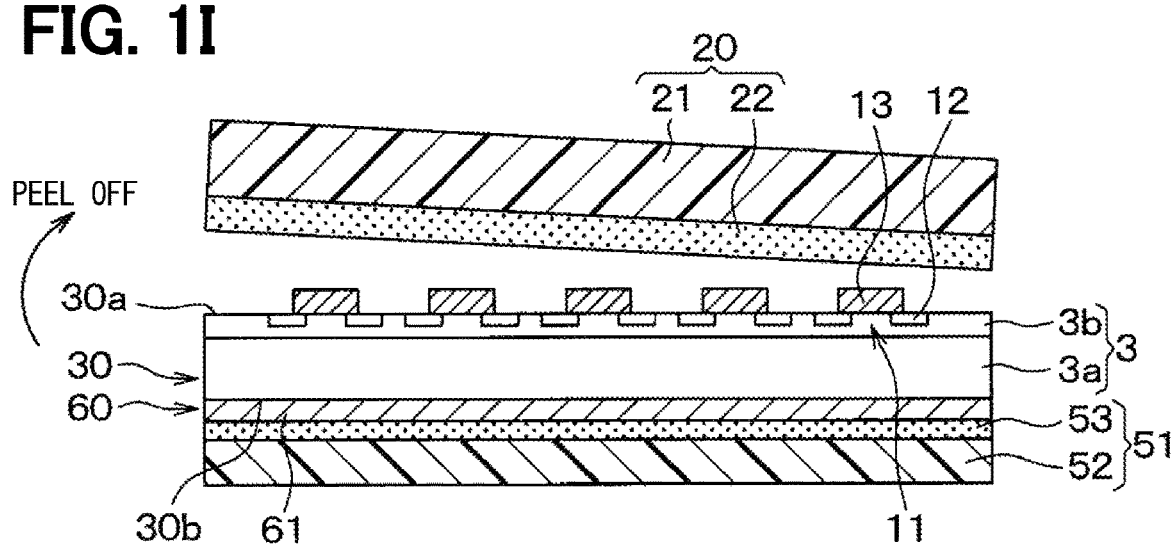
FIG. 1I is a cross-sectional view illustrating a manufacturing process of the semiconductor chip subsequent to FIG. 1H.

After that, as shown in FIG. 1I, the support base 21 attached to the other surface 30b side of the chip formation wafer 30 is peeled off. Here, a process of reducing the adhesive force of the adhesive layer 22 that attaches the support base 21 to the chip formation wafer 30, for example, UV irradiation is performed when the adhesive layer 22 is made of a UV resin adhesive.

Figure 1J:
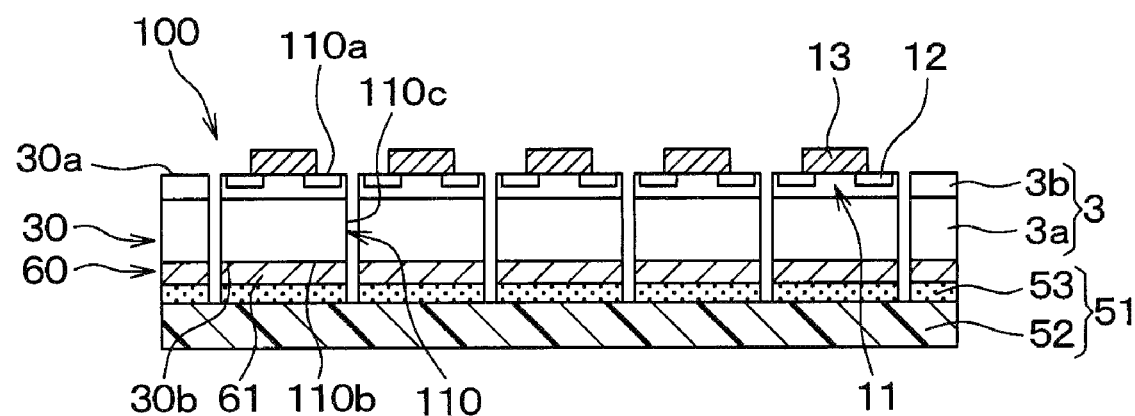
FIG. 1K is a cross-sectional view showing a manufacturing process of a recycle wafer subsequent to FIG. 1F.

Subsequently, as shown in FIG. 1J, each semiconductor chip 100 is configured by individualizing the chip formation wafer 30 into chip units by a dicing saw, laser dicing, or the like. At this time, the dicing depth is adjusted so that the holding member 51 remains connected without being cut while the chip formation wafer 30 is divided into chip units.

Although the subsequent steps are not shown, the holding member 51 is expanded and the distance between the semiconductor chips 100 is widened at the dicing cut portion. After that, the adhesive force of the adhesive 53 is weakened by heat treatment or irradiation with light, and the semiconductor chip 100 is picked up. As a result, the semiconductor chip 100 is manufactured.

Further, the semiconductor chip 100 manufactured as described above includes a chip formation substrate 110 having one surface 110a, another surface 110b on the opposite side to the one surface, and a side surface 110c connecting the one surface 110a and the other surface 110b. Further, the chip formation substrate 110 has an epitaxial film 3 made of GaN, the one surface side element component 11 is formed on the one surface 110a side, and the other surface side element component 60 is formed on the other surface 110b side.

Figure 1K:
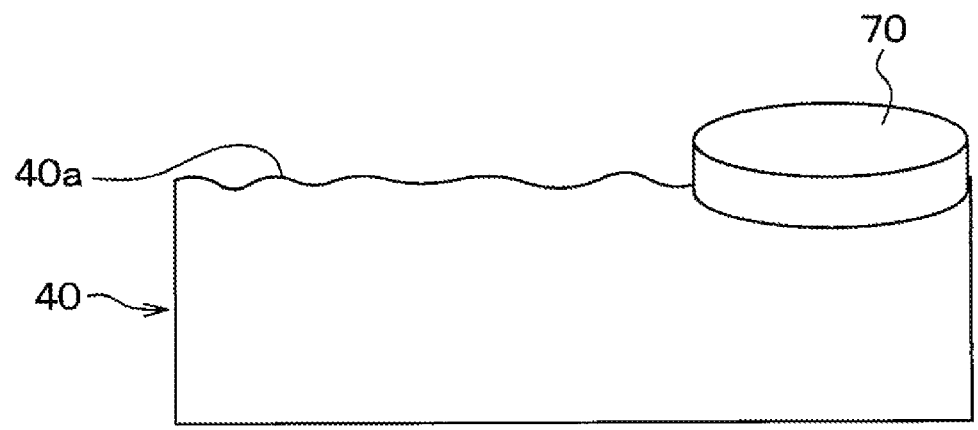

Further, as shown in FIG. 1K, the one surface 40a of the recycle wafer 40 configured in FIG. 1F is flattened by performing a CMP method using a polishing apparatus 70 or the like on the one surface 40a. Then, the flattened recycle wafer 40 is used as the GaN wafer 1, and the steps after FIG. 1A are performed again. As a result, the GaN wafer 1 can be used a plurality of times to form the semiconductor chip 100.

According to the present embodiment described above, the processed wafer 10 is divided into a chip formation wafer 30 and a recycle wafer 40, and the recycle wafer 40 is used again as the GaN wafer 1. Therefore, it is not necessary to newly prepare the GaN wafer 1 every time the semiconductor chip 100 is manufactured, and the GaN wafer 1 can be effectively used. Therefore, the method for manufacturing the GaN semiconductor device can improve the productivity.

Second Embodiment

A second embodiment will be described. This embodiment is different from the first embodiment because the method of dividing the chip formation wafer 30 and the recycle wafer 40 is changed from the first embodiment, and the other parts are similar to those of the first embodiment. Only the different part will be described.

In the first embodiment, the shape of the GaN wafer 1 has been described as a bulk wafer shape having one surface 1a and another surface 1b, that is, a simple disk shape. In some cases, depending on the shape, it may be difficult to divide the chip formation wafer 30 and the recycle wafer 40. Therefore, in the present embodiment, the chip formation wafer 30 and the recycle wafer 40 can be more easily separated.

In general, a semiconductor wafer such as a silicon wafer has an outer edge portion rounded by a beveling process, and one surface and the other surface of the semiconductor wafer have a similarly rounded shape at the outer edge portion. Then, the semiconductor wafer is in a rounded state from the outer peripheral end position having the largest outer diameter to the flat surface portion of one surface or the other surface. By rounding the outer edge portions on one surface and the other surface in this way, it is possible to prevent the resist applied for patterning from being blocked at the outer edge portion during the formation of the semiconductor element, and to restrict the resist at the outer edge portion from being thickening than the resist at the inner peripheral portion. Further, by polishing the corners of the outer edges of one surface and the other surface of the semiconductor wafer, it is possible to suppress chipping during handling.

Figure 2A:
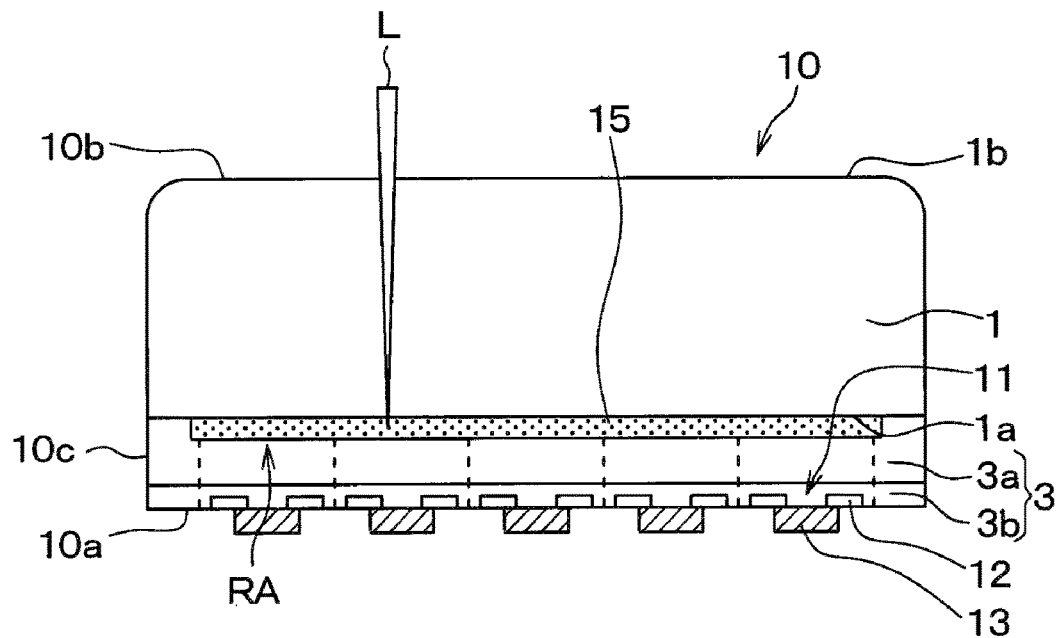
FIG. 2A is a cross-sectional view of a processed wafer showing a state in which a transformation layer for chips is formed only on an inner peripheral portion.
Figure 2B:
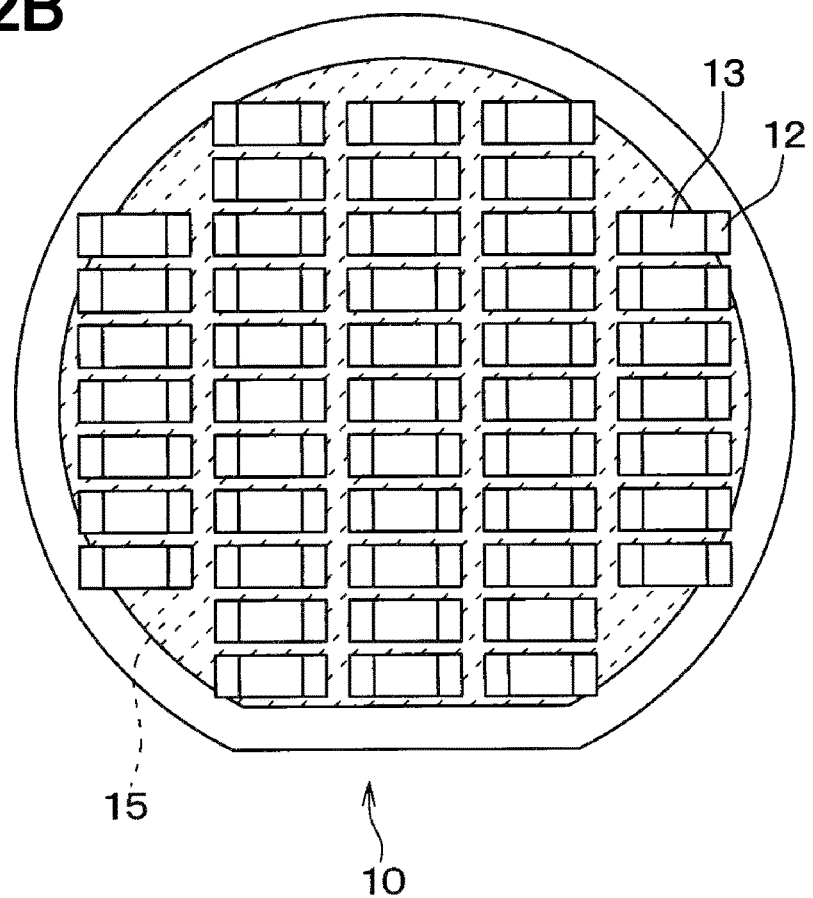
FIG. 2B is a front view of a processed wafer showing a state in which a transformation layer for chips is formed only on an inner peripheral portion.
Figure 2C:
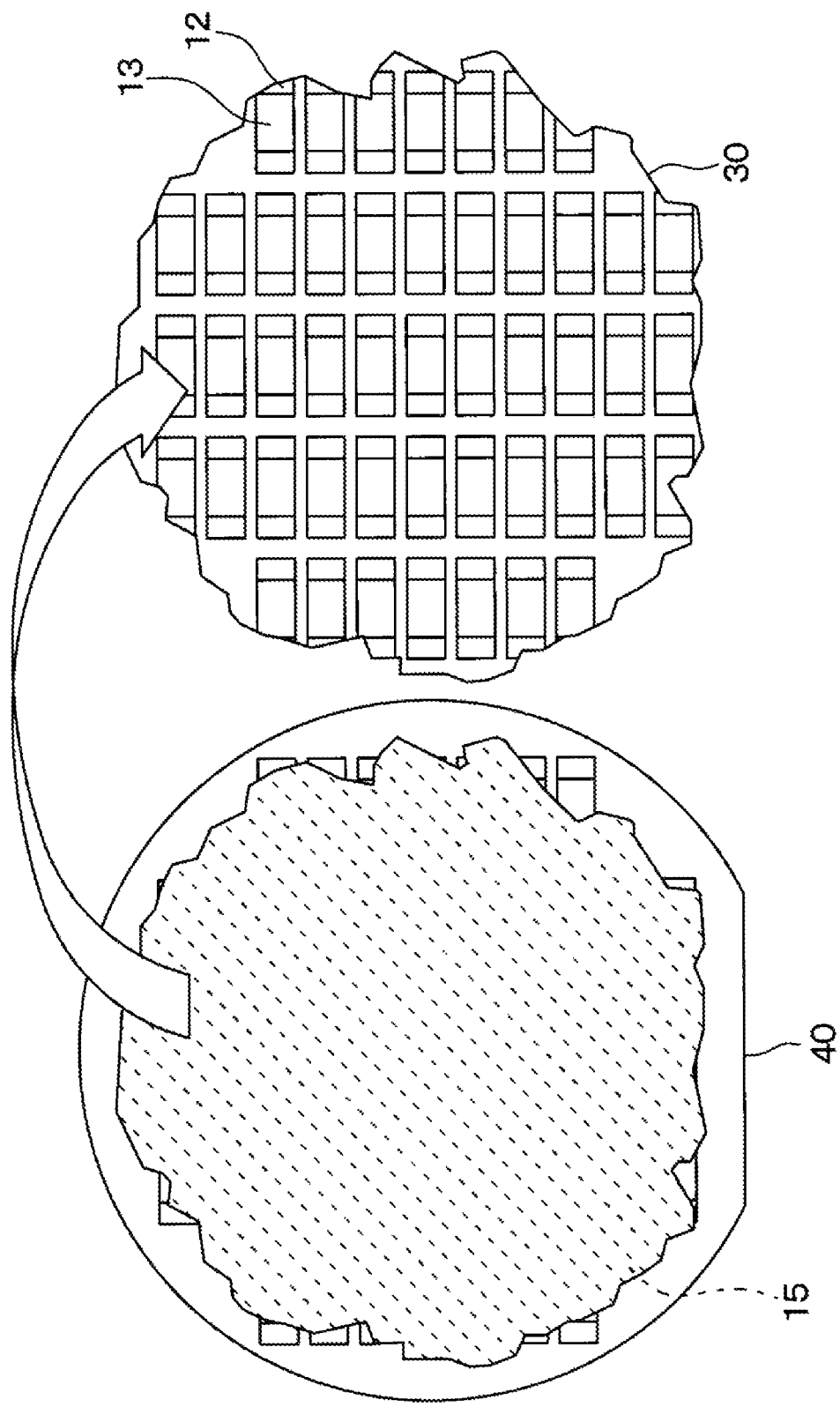
FIG. 2C is a diagram showing a state in which a chip formation wafer and a recycle wafer are divided in the state of FIG. 2B.

However, as shown in FIG. 2A, if the outer edge portion of the GaN wafer 1 is rounded by the beveling process, the wafer transformation layer 15 may not be properly formed on the outer edge portion of the processed wafer 10. Specifically, as shown in FIG. 2A, even if the laser beam L is irradiated from the GaN wafer 1 side of the processed wafer 10, the beam cannot focus at the rounded outer edge portion, and the wafer transformation layer 15 may not be formed at the outer edge portion of the processed wafer 10. Therefore, as shown by hatching in FIG. 2B, the wafer transformation layer 15 is formed in the inner peripheral portion of the processed wafer 10, but the wafer transformation layer 15 is not formed on the outer edge portion. Therefore, as shown in FIG. 2C, when the chip formation wafer 30 and the recycle wafer 40 are divided at the wafer transformation layer 15 as a boundary, only the inner peripheral portion is peeled off and the outer edge portion is not peeled off well.

Figure 3:
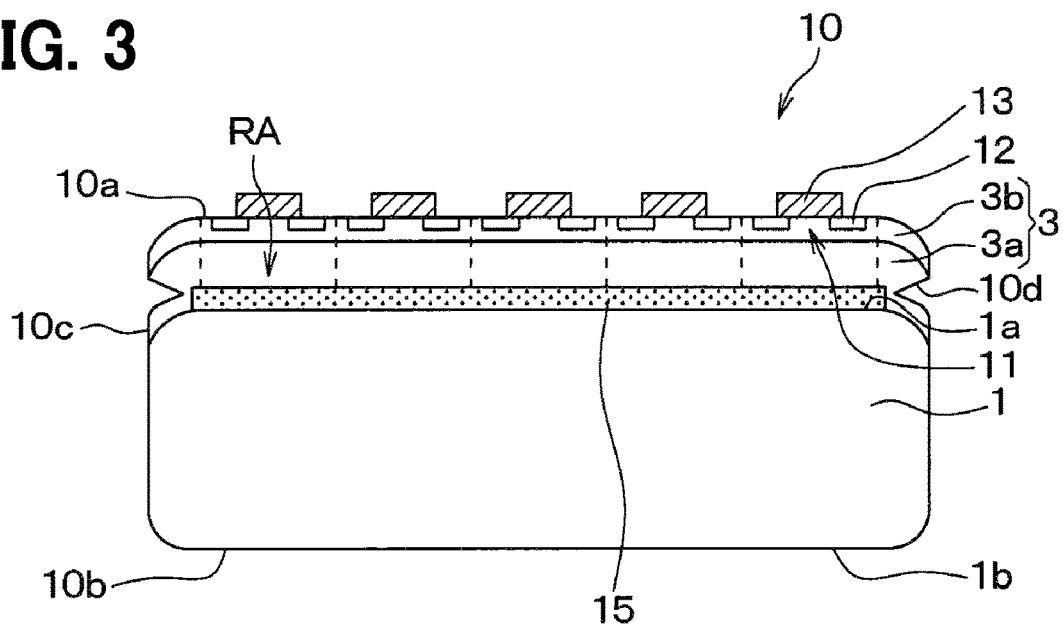
FIG. 3 is a cross-sectional view of a processed wafer described in the second embodiment.

On the other hand, in the present embodiment, as shown in FIG. 3, a notch groove 10d is formed at a position corresponding to the wafer transformation layer 15 on the side surface 10c of the processed wafer 10. The notch groove 10d can be formed by preparing a grindstone with a sharp tip before or after forming the wafer transformation layer 15 and moving the grindstone so as to surround the outer circumference of the processed wafer 10.

If the notch groove 10d is formed in this way, when the chip formation wafer 30 and the recycle wafer 40 are divided, the notch groove 10d and the wafer transformation layer 15 can be easily connected to each other, and easily divided.

In addition, in FIG. 3, for easy viewing, the state where the one side 1a side is flat to the outer peripheral side is shown, alternatively, as described above, the outer peripheral portion on the one side 1a side remains rounded by the beveling process.

Third Embodiment

A third embodiment will be described. In the present embodiment, a shape of the GaN wafer 1 is different from the first embodiment. Since the other parts are similar to the first embodiment, parts difference from the first embodiment will be described.

In the first embodiment, the shape of the GaN wafer 1 has been described as a bulk wafer shape having one surface 1a and an other surface 1b, that is, a simple disk shape, but in the present embodiment, the shape of the outer edge portion of the GaN wafer 1 is the shape suitable for recycling the GaN wafer 1.

Figure 4:
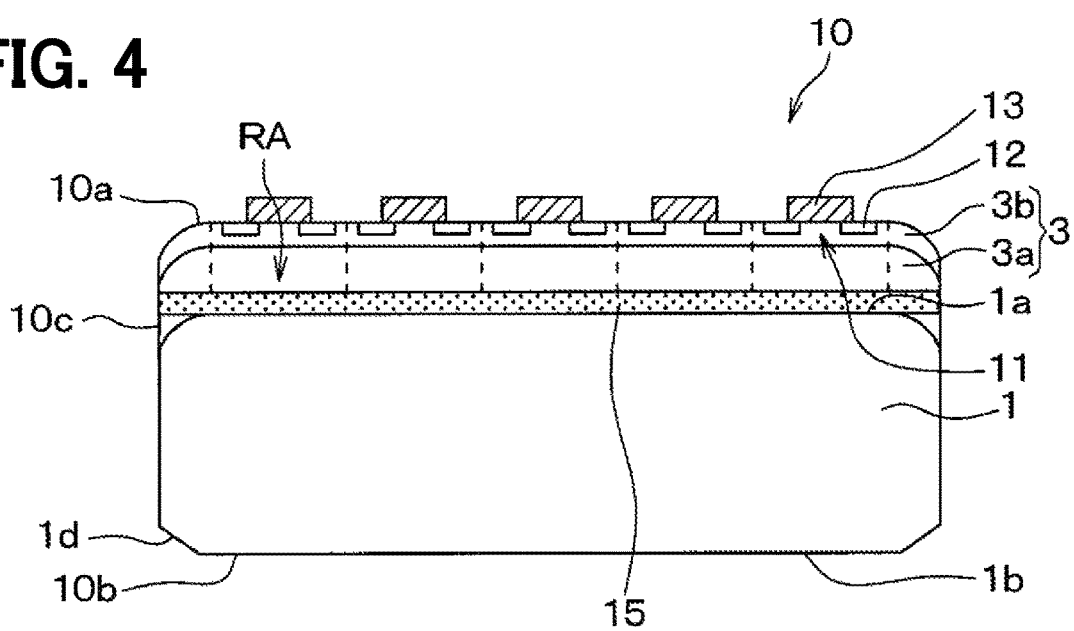
FIG. 4 is a cross-sectional view of a processed wafer described in the third embodiment.

Specifically, in the present embodiment, as shown in FIG. 4, the outer edge portion of the GaN wafer 1 on the other surface 1b side includes a tapered portion 1d whose thickness becomes thinner from the inner peripheral portion side located inside the outer edge portion to the outer peripheral side. In other words, the tapered portion 1d is formed by an inclined surface whose outer surface 1b side is closer to the one surface 1a side toward the outer peripheral side from the inner peripheral side. The width of the portion that is the tapered portion 1d, that is, the distance from the outermost portion of the outer edge portion to the inner peripheral portion of the other surface 1b that is inside the tapered portion 1d is a predetermined width, for example, it is 100 µm to 200 µm. The tapered portion 1d has a linear shape in a cross section cut along the radial direction from the center of the GaN wafer 1 as shown in FIG. 4. Such a tapered portion 1d can be formed by, for example, polishing with pressing a grindstone diagonally against the outer edge portion of the GaN wafer 1.

Figure 5:
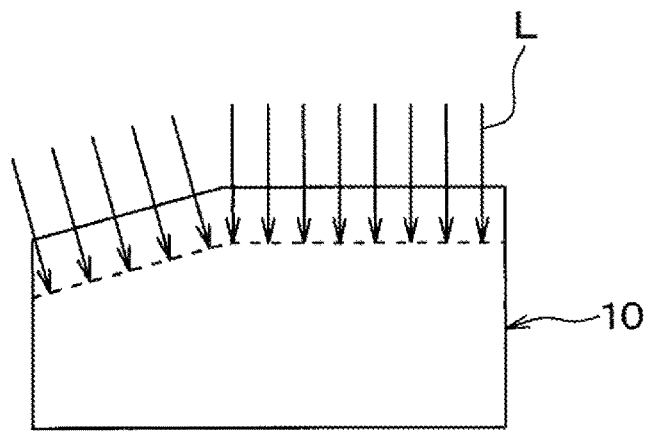
FIG. 5 is an enlarged cross-sectional view schematically showing a state of laser irradiation at an outer edge portion of a processed wafer.

Further, in the present embodiment, the tapered portion 1d is provided on the outer edge portion of the other surface 1b so that the cross-sectional shape of the tapered portion 1d is linear. Therefore, when laser irradiation is performed from the GaN wafer 1 side, the beam can be focused as shown in FIG. 5, and the wafer transformation layer 15 can be properly formed. Therefore, the wafer transformation layer 15 is properly formed not only on the inner peripheral portion of the processed wafer 10 but also on the outer peripheral portion. Therefore, when the chip formation wafer 30 and the recycled wafer 40 are divided at the wafer transformation layer 15 as a boundary, not only the inner peripheral portion but also the outer peripheral portion can be successfully peeled off. Therefore, the chip formation wafer 30 can be maintained in a disk shape, and the outer edge of the chip formation wafer 30 is prevented from remaining on the outer edge of the recycle wafer 40, so that the shape suitable for recycling can be obtained.

Modification of Third Embodiment

Figure 6A:
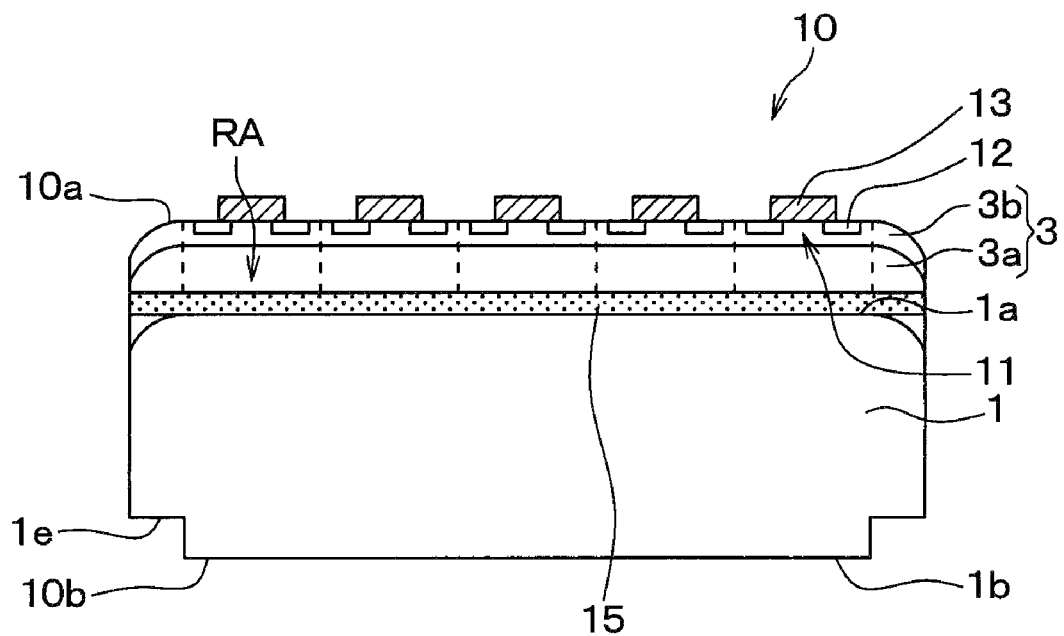
FIG. 6A is a cross-sectional view of a processed wafer described in a modified example of the third embodiment.
Figure 6B:
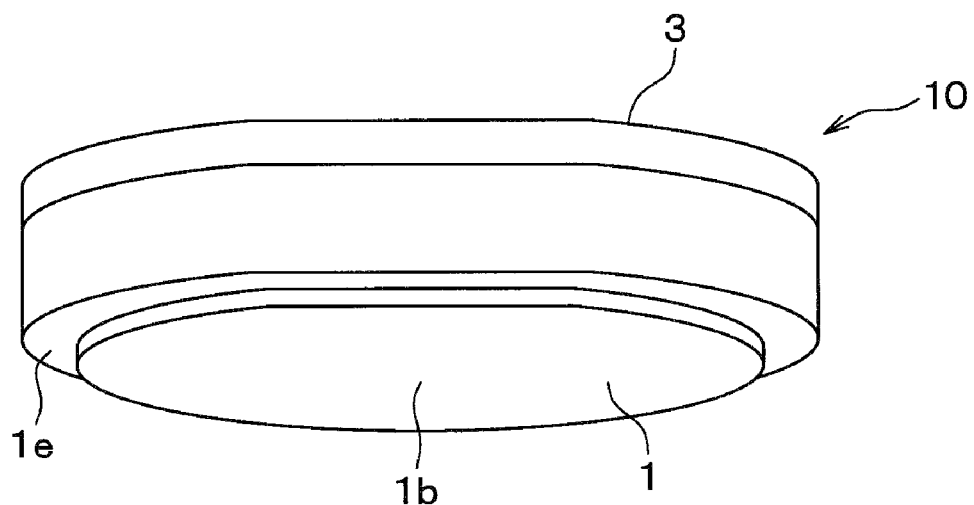
FIG. 6B is a perspective view of the processed wafer shown in FIG. 6A as viewed from diagonally below.

In the third embodiment, the tapered portion 1d is formed on the outer edge portion of the GaN wafer 1. On the other hand, as shown in FIGS. 6A and 6B, at least the outer edge portion on the other surface 1b side of the GaN wafer 1 is thinner at the inner peripheral portion side located inside the outer edge portion, and the wafer 1 may include the step portion 1e having a surface along the plane direction of the wafer 1. Such a step portion 1e can also be formed, for example, by pressing a grindstone against the outer edge portion of the GaN wafer 1 and polishing it.

As described above, even if the stepped portion 1e has a flat surface, the laser beam L can be focused, and the same effect as that of the second embodiment can be obtained.

Fourth Embodiment

A fourth embodiment will be described. This embodiment is different from the first embodiment because the method of dividing the chip formation wafer 30 and the recycle wafer 40 is changed from the first embodiment, and the other parts are similar to those of the first embodiment. Only the different part will be described.

As described in the second embodiment, when the GaN wafer 1 is beveled and the outer edge portion has a rounded shape, the wafer transformation layer 15 may not be properly formed on the outer edge portion of the processed wafer 10 in some cases.

Figure 7A:
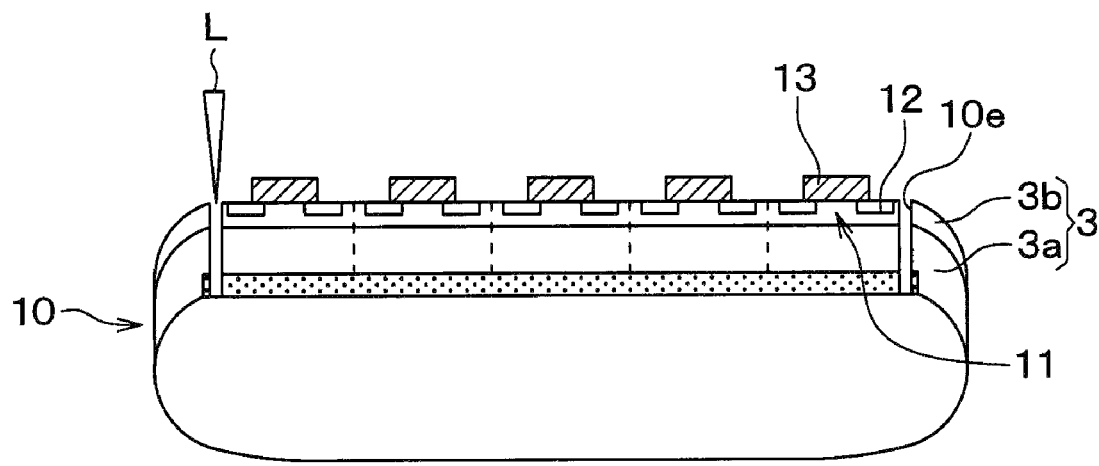
FIG. 7A is a cross-sectional view of a processed wafer described in the fourth embodiment.
Figure 7B:
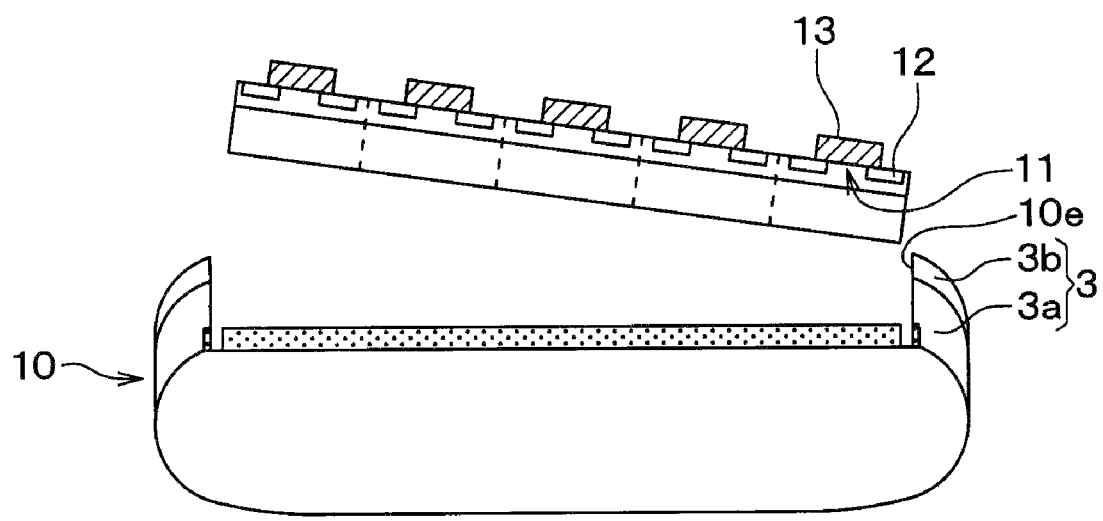
FIG. 7B is a diagram showing a state in which a chip formation wafer is peeled off from the processed wafer shown in FIG. 7A.

Therefore, in the present embodiment, as shown in FIG. 7A, the groove portion 10e is formed by irradiating the one surface 10a side at the boundary between the outer edge portion and the inner peripheral portion of the processed wafer 10 with the laser beam L so that the groove portion 10e reaches the wafer transformation layer 15. The timing of laser irradiation for forming the groove portion 10e is arbitrary, and may be before or after forming the wafer transformation layer 15. Then, as shown in FIG. 7B, the inner portion of the groove portion 10e is retrieved as the chip formation wafer 30 from the one surface 10a side of the processed wafer 10.

Even in this way, the chip formation wafer 30 and the recycle wafer 40 can be separated. In this case, by forming the groove portion 10e into a disk shape, preferably into the disk shape with an orientation flat or a notch, the chip formation wafer 30 can be handled in the subsequent process while remaining the chip formation wafer 30 in the disk shape.

After the chip formation wafer 30 and the recycle wafer 40 are separated, a portion located outside the chip formation wafer 30 remains on the outer edge of the recycle wafer 40, but when the recycle wafer 40 is recycled, it is necessary to remove the portion by flattening.

Fifth Embodiment

A fifth embodiment will be described. This embodiment is different from the first embodiment because the method of dividing the chip formation wafer 30 and the recycle wafer 40 is changed from the first embodiment, and the other parts are similar to those of the first embodiment. Only the different part will be described.

Figure 8:
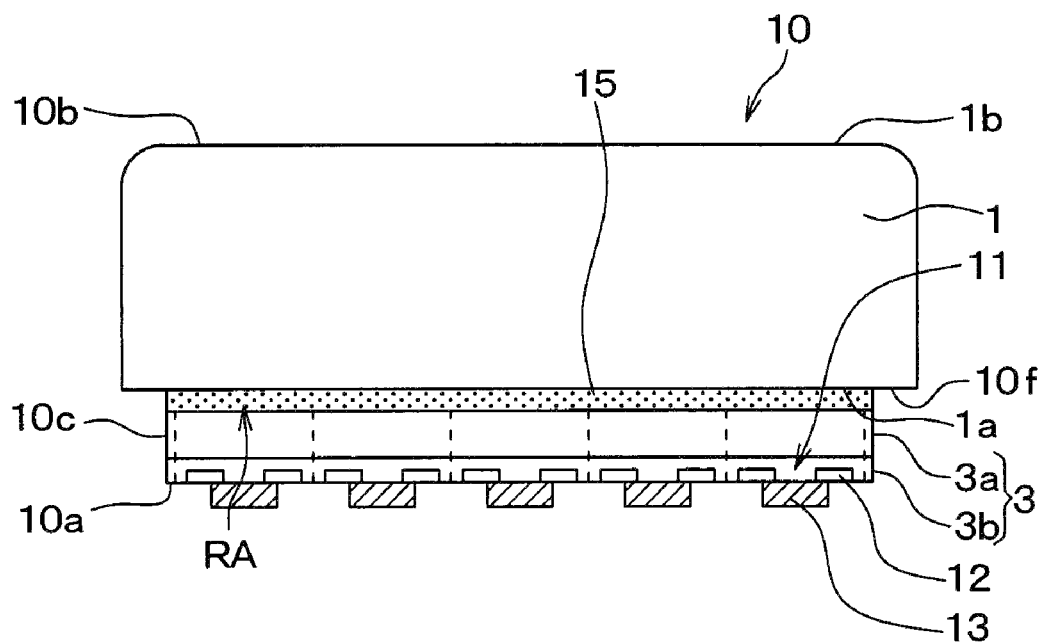
FIG. 8 is a cross-sectional view of a processed wafer described in the fifth embodiment.

In the present embodiment, as shown in FIG. 8, the outer edge portion is cut out on the one side 10a side of the processed wafer 10 to form the step portion 10f. The step portion 10f can be formed, for example, by polishing with a ring-shaped grindstone. The timing of forming the step portion 10f is arbitrary, and laser irradiation may be performed after forming the step portion 10f to form the wafer transformation layer 15, or after forming the wafer transformation layer 15, the step portion 10f may be formed.

Even if the step portion 10f is formed in this way, the same effect as that of the third embodiment can be obtained. The depth of the step portion 10f may be matched with the formation position of the wafer transformation layer 15 or may be deeper than the formation position of the wafer transformation layer 15. When the depth of the step portion 10f is deeper than the formation position of the wafer transformation layer 15, the recycle wafer 40 may be recycled while remaining the step portion 10f.

Sixth Embodiment

A sixth embodiment will be described. This embodiment is different from the first embodiment because the method of dividing the chip formation wafer 30 and the recycle wafer 40 is changed from the first embodiment, and the other parts are similar to those of the first embodiment. Only the different part will be described.

Figure 9:
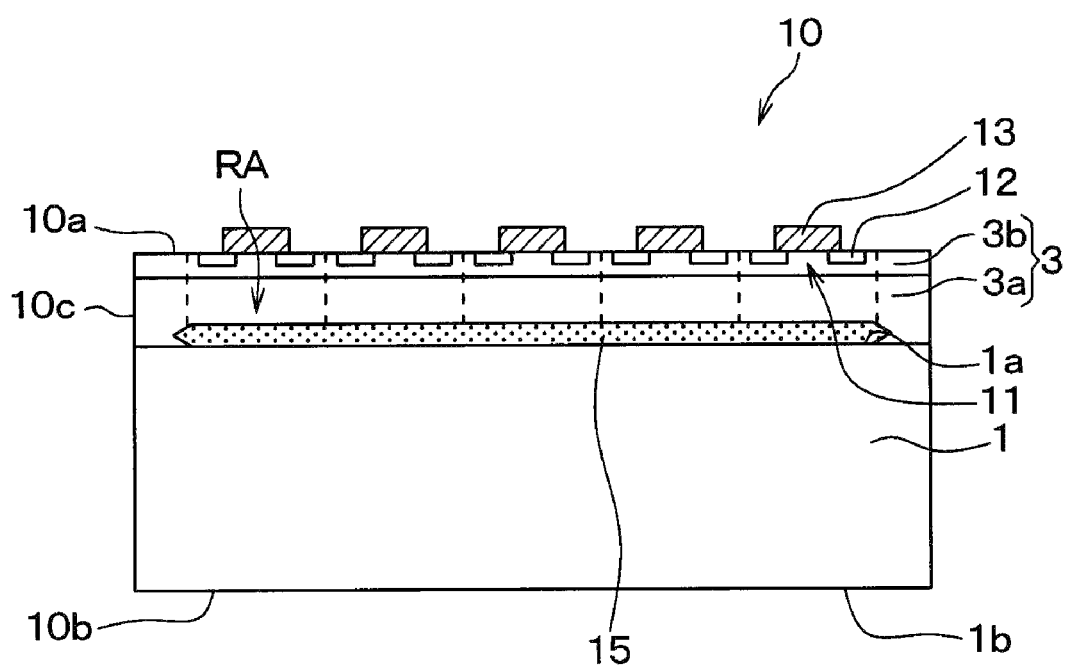
FIG. 9 is a cross-sectional view of a processed wafer described in the sixth embodiment.

In the present embodiment, as shown in FIG. 9, the wafer transformation layer 15 has a sharp shape at the outer peripheral portion. Here, the wafer transformation layer 15 has the largest outer diameter at the intermediate position in the thickness direction, and the outer diameter is smaller on the one surface 10a side and the other surface 10b of the processed wafer 10 than the intermediate position. The wafer transformation layer 15 having such a shape can be formed by performing laser irradiation stepwise in the depth direction and adjusting the laser irradiation range in each step.

When the wafer transformation layer 15 has a sharp shape at the outer peripheral portion in this way, cracks are likely to occur from that portion, and the chip formation wafer 30 and the recycle wafer 40 can be easily divided.

Other Embodiments

Although the present disclosure is made with reference to the embodiments described above, the present disclosure is not limited to such embodiments but may include various changes and modifications which are within equivalent ranges. Furthermore, various combination and formation, and other combination and formation including one, more than one or less than one element may be made within the spirit and scope of the present disclosure.

For example, in each of the above embodiments, the epitaxial film 3 may be made of only the n⁻ type epitaxial layer 3a.

Further, in each of the above embodiments, in the process of FIG. 1G, the metal film 61 may be formed without polishing the other surface 30b of the chip formation wafer 30. For example, when an optical semiconductor element or the like is formed as a semiconductor element, by remaining a concavo-convex structure on the other surface 30b side, it is possible to effectively extract light from the other surface 30b side.

Further, in each of the above embodiments, in the step of forming the epitaxial film 3 of FIG. 1B, the epitaxial film may be formed on the other surface 1b side of the GaN wafer 1. According to this, for example, even when the wafer transformation layer 15 is formed in the GaN wafer 1, it becomes easy to remain a thickness equal to or more than a predetermined thickness as the recycle wafer 40, and the number of times that the recycle wafer can be recycled can be increased.

Further, in the first and second embodiments, the step of forming the wafer transformation layer 15 of FIG. 1E may be performed before the step of arranging the support member 20 of FIG. 1D. In this case, the laser beam L may be irradiated from the one surface 10a of the processed wafer 10. Here, when the laser beam L is irradiated from the one surface 10a of the processed wafer 10, the position of the condensing point of the laser beam L may vary depending on the surface electrode, the wiring pattern, or the like formed on the one surface 10a side. Therefore, it may be preferable to irradiate the laser beam from the other surface 10b of the processed wafer 10.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A method for manufacturing a gallium nitride semiconductor device having a semiconductor element made of gallium nitride comprising:
  preparing a gallium nitride wafer having one surface and another surface opposite to the one surface;
  forming an epitaxial growth film on the one surface of the gallium nitride wafer to provide a processed wafer including the gallium nitride wafer and the epitaxial growth film and having a plurality of chip formation regions;
  performing a surface side process as a semiconductor process on a one surface side of the processed wafer, on which the epitaxial growth film is disposed, for processing the one surface side of the semiconductor element in the processed wafer;
  after the performing of the surface side process, removing the gallium nitride wafer of the processed wafer and dividing the processed wafer into a chip formation wafer and a recycle wafer including the gallium nitride wafer; and
  after the dividing of the processed wafer, forming an other surface side element component by performing a back side process on an other surface side of the chip formation wafer opposite to the one surface side on which the surface side process is performed, as the semiconductor process for the other surface side of the chip formation wafer, wherein:
  the dividing of the processed wafer includes:
    irradiating the processed wafer with laser light from the GaN wafer side and forming a transformation layer on at least one of the epitaxial growth film and the GaN wafer; and
    after the forming of the transformation layer, dividing the processed wafer into the chip formation wafer and the recycle wafer,
  the method for manufacturing the gallium nitride semiconductor device further includes before or after the forming of the transformation layer, forming a groove on an outer edge portion of the gallium nitride wafer on the surface thereof on which the epitaxial growth film is arranged,
  the forming of the transformation layer includes forming the transformation layer at a position corresponding to a bottom of the groove,
  the dividing the processed wafer includes:
    dividing the processed wafer into the chip formation wafer and the recycle wafer by the transformation layer; and
    retrieving the chip formation wafer located inside the groove from the groove, and
  the groove is formed on the outer edge portion of the plurality of chip formation regions corresponding to the chip formation wafer.

2. The method for manufacturing the gallium nitride semiconductor device according to claim 1, wherein:
  the preparing of the processed wafer includes:
    forming a first gallium nitride layer for providing a part of the epitaxial growth film on the one surface of the gallium nitride wafer; and
    forming a second gallium nitride layer for providing another part of the epitaxial growth film on a surface of the first gallium nitride layer opposite to the gallium nitride wafer; and
  the forming of the transformation layer includes: forming the transformation layer on at least one of the first gallium nitride layer as the epitaxial growth film and the gallium nitride wafer.

3. The method for manufacturing the gallium nitride semiconductor device according to claim 2, wherein:
  the forming of the transformation layer includes: converting the gallium nitride into nitrogen and liquid gallium by the irradiating with the laser beam.

4. The method for manufacturing the gallium nitride semiconductor device according to claim 2, further comprising:

arranging a support member on the surface of the second gallium nitride layer after the forming of the processed wafer and before the dividing; and removing the support member from the processed wafer after the forming of the other surface side element component.

5. The method for manufacturing the gallium nitride semiconductor device according to claim 1, wherein:

the groove is formed into a disk shape with a flat orientation or a notch, thereby providing the chip formation wafer in a disk shape.

* * * * *